United States Patent
Baba et al.

(10) Patent No.: US 12,302,602 B2
(45) Date of Patent: May 13, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shotaro Baba, Kanazawa Ishikawa (JP); Hiroaki Katou, Nonoichi Ishikawa (JP); Saya Shimomura, Komatsu Ishikawa (JP); Tatsuya Nishiwaki, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 483 days.

(21) Appl. No.: 17/682,994

(22) Filed: Feb. 28, 2022

(65) Prior Publication Data

US 2023/0073420 A1    Mar. 9, 2023

(30) Foreign Application Priority Data

Sep. 8, 2021  (JP) ................................. 2021-146266

(51) Int. Cl.
  *H10D 30/66*  (2025.01)
  *H10D 62/10*  (2025.01)
  *H10D 64/23*  (2025.01)

(52) U.S. Cl.
  CPC ......... *H10D 30/668* (2025.01); *H10D 62/127* (2025.01); *H10D 64/256* (2025.01)

(58) Field of Classification Search
  None
  See application file for complete search history.

(56) References Cited

U.S. PATENT DOCUMENTS 7,344,943 B2  3/2008  Herrick et al.
7,642,597 B2  1/2010  Saito
(Continued)

FOREIGN PATENT DOCUMENTS

JP  2007529115 A  10/2007
JP  2008124346 A  5/2008
(Continued)

OTHER PUBLICATIONS

Tatsuya Nishiwaki et al., "Design Criteria for Shoot-Through Elimination in Trench Field Plate Power MOSFET", Proceedings of the 26th International Symposium on Power Semiconductor Devices & IC's, Jun. 15-19, 2014, Waikoloa, Hawaii, pp. 382-385.
(Continued)

*Primary Examiner* — Jay C Chang
(74) *Attorney, Agent, or Firm* — Kim & Stewart LLP

(57) ABSTRACT

According to one embodiment, a semiconductor device includes a first electrode, a second electrode, and a semiconductor layer between the first electrode and the second electrode. A third electrode is in the semiconductor layer. The third electrode extends in a second direction orthogonal to the first direction. A plurality of fourth electrodes are connected to the second electrode and extend in the first direction into the semiconductor layer. The fourth electrodes are spaced from one another along the second direction. A fifth electrode that is electrically isolated from the first electrode and between the first electrode and the plurality of fourth electrodes. The fifth electrode extends in the second direction and contacts the lower ends of the plurality of fourth electrodes in the trench.

19 Claims, 15 Drawing Sheets

(56) References Cited

U.S. PATENT DOCUMENTS

| | | |
|---|---|---|
| 8,643,091 B2 | 2/2014 | Saito et al. |
| 11,239,357 B2 | 2/2022 | Nishiwaki |
| 2007/0190728 A1 | 8/2007 | Sreekantham et al. |
| 2010/0117144 A1 | 5/2010 | Hirler |
| 2012/0061753 A1* | 3/2012 | Nishiwaki ............ H01L 29/407 |
| | | 257/E29.264 |
| 2017/0263768 A1* | 9/2017 | Katoh ............... H01L 29/66666 |
| 2018/0240867 A1* | 8/2018 | Nitta ................ H01L 29/42368 |
| 2019/0123158 A1 | 4/2019 | Ohtani |

FOREIGN PATENT DOCUMENTS

| | | |
|---|---|---|
| JP | 2009526410 A | 7/2009 |
| JP | 2012059841 A | 3/2012 |
| JP | 2016192440 A | 11/2016 |
| JP | 2017147431 A | 8/2017 |
| JP | 2021034540 A | 3/2021 |
| JP | 7013606 B1 | 1/2022 |
| WO | 2017168734 A1 | 10/2017 |

OTHER PUBLICATIONS

Jingjing Chen, "Design Optimal Built-in Snubber in Trench Field Plate Power MOSFET for Superior EMI and Efficiency Performance", International Rectifier, an Infineon Technologies Company, SISPAD 2015, Sep. 9-11, 2015, Washington, DC, USA, pp. 459-462.
Kyoichi Suguro, "Ultra-fine low resistance gate electrode wiring technology", Applied physics, vol. 68, No. 11, 1999, 11 pages.
Japanese Office Action dated Jul. 10, 2024, mailed in counterpart Japanese Application No. 2021-146266, 11 pages (with translation).

\* cited by examiner

SEMICONDUCTOR DEVICE

CROSS-REFERENCE TO RELATED APPLICATION(S)

This application is based upon and claims the benefit of priority from No. 2021-146266, filed Sep. 8, 2021, the entire contents of which are incorporated herein by reference.

FIELD

Embodiments described herein relate generally to a semiconductor device.

BACKGROUND

A vertical MOSFET (metal-oxide-semiconductor field-effect transistor) has been developed as a power control semiconductor device particularly for use as a switching element. In the vertical MOSFET, a semiconductor material is provided between a source electrode and a drain electrode. Gate electrodes are provided in the semiconductor material. By applying a predetermined potential to the gate electrodes, electric conductivity of the semiconductor material is controlled and a current can be passed between the source electrode and the drain electrode in a controlled manner.

In a vertical MOSFET, trenches are sometimes formed in the semiconductor material and then an embedded source electrode is provided in each of the trenches for improving a breakdown voltage between the source electrode and the drain electrode. In such cases, it is preferable that the resistance (referred to as a source resistance) between the source electrode and the embedded portions of the source electrode be adjustable in a circuit design phase or the like since the source resistance affects efficiency of the MOSFET.

DETAILED DESCRIPTION

Embodiments provide a semiconductor device having an adjusting a source resistance.

In general, according to one embodiment, a semiconductor device a semiconductor device includes a first electrode, a second electrode, and a semiconductor layer between the first electrode and the second electrode. A third electrode is formed in the semiconductor layer. The third electrode extends in a second direction orthogonal to the first direction. A plurality of fourth electrodes are connected to the second electrode and extend in the first direction. The fourth electrodes are spaced from one another along the second direction. A fifth electrode that is electrically isolated from the first electrode and between the first electrode and the plurality of fourth electrodes. The fifth electrode extends in the second direction and contacts the ends of the plurality of fourth electrodes.

Certain example embodiments of the present disclosure will be described hereinafter with reference to the drawings.

In general, the drawings are schematic and conceptual and provided for explanation of various technical concepts. As such, the depicted relationships between a thickness and a width of each element, proportions between the elements, and the like are not necessarily those of an actual device or the like. Thus, elements may be represented differently in dimensions or proportions in different drawings.

In the present disclosure, substantially similar elements are given the same reference symbols and detailed descriptions thereof may be omitted after a previous explanation of such element (s).

In the following, notations n+, n, and n− represent relative n-type impurity concentrations between regions/elements so designated. Likewise, p+, p, and p− represent relative p-type impurity concentrations between regions/elements so designated. If both a p-type impurity and an n-type impurity are contained in a region, the n-type or p-type notations represent net impurity concentrations, that is an impurity level/type after the different impurity types in the same region/element are netted amongst each other.

The example embodiments described hereinafter may be similarly carried out by inverting the p type and n type regions (that is, switching p type regions for n type regions and vice versa).

First Embodiment

A semiconductor device according to a first embodiment is, for example, a power control vertical MOSFET that can be used as a switching element.

Figure 1A:
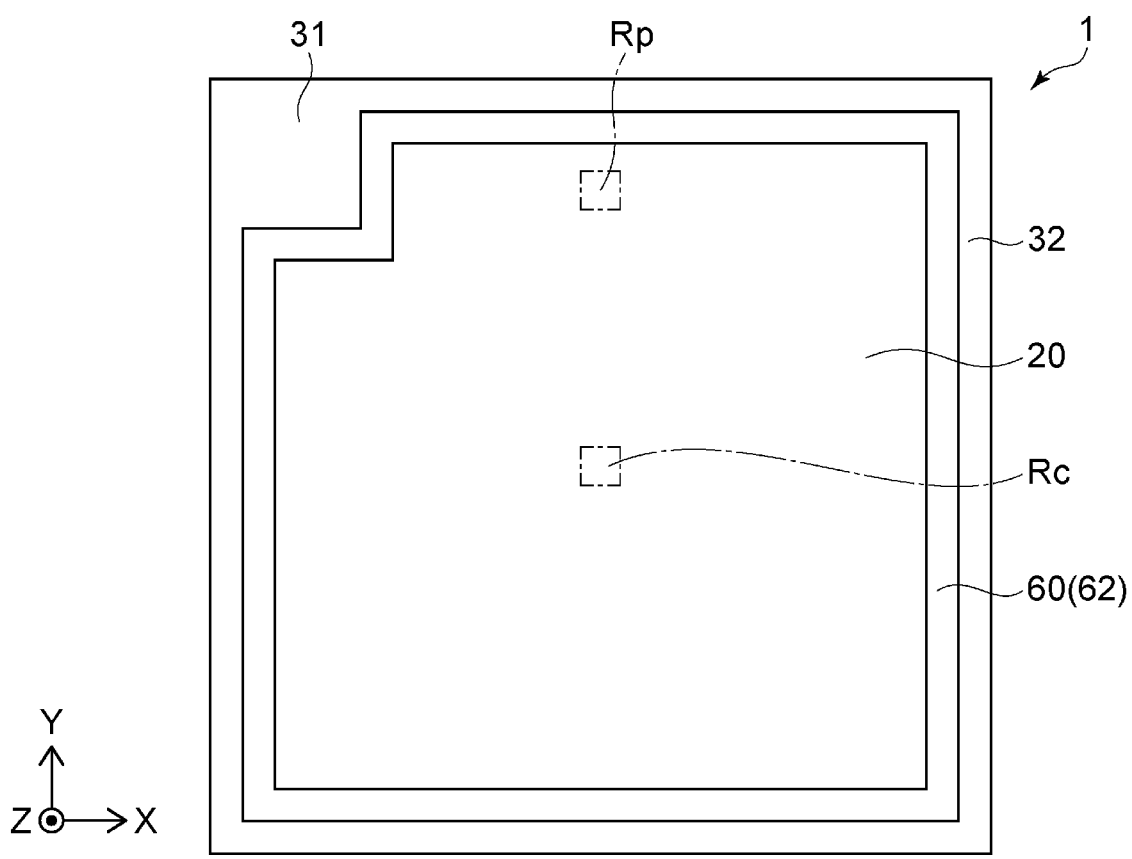
FIG. 1A is a top view illustrating a semiconductor device according to a first embodiment.
Figure 1B:
FIG. 1B is a bottom view illustrating a semiconductor device according to a first embodiment.

FIG. 1A is a top view illustrating the semiconductor device according to the first embodiment, and FIG. 1B is a bottom view illustrating the semiconductor device according to the first embodiment.

Figure 2:
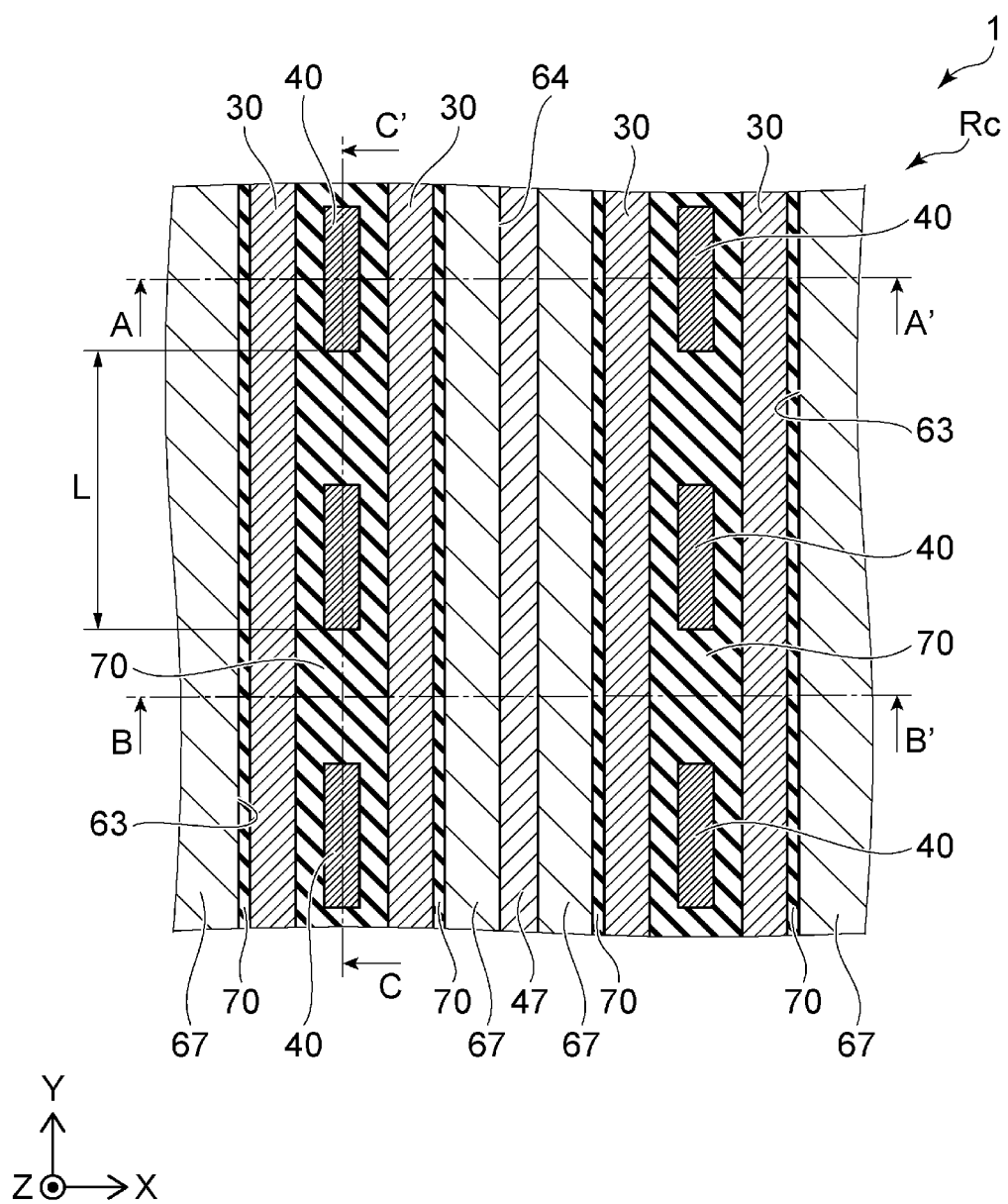
FIG. 2 is a top view illustrating a semiconductor device according to a first embodiment.

FIG. 2 is a top view illustrating the semiconductor device according to the first embodiment. FIG. 2 illustrates a cell region Rc of FIG. 1A and a cross-section taken along line D-D' illustrated in FIGS. 3 to 5.

Figure 3:
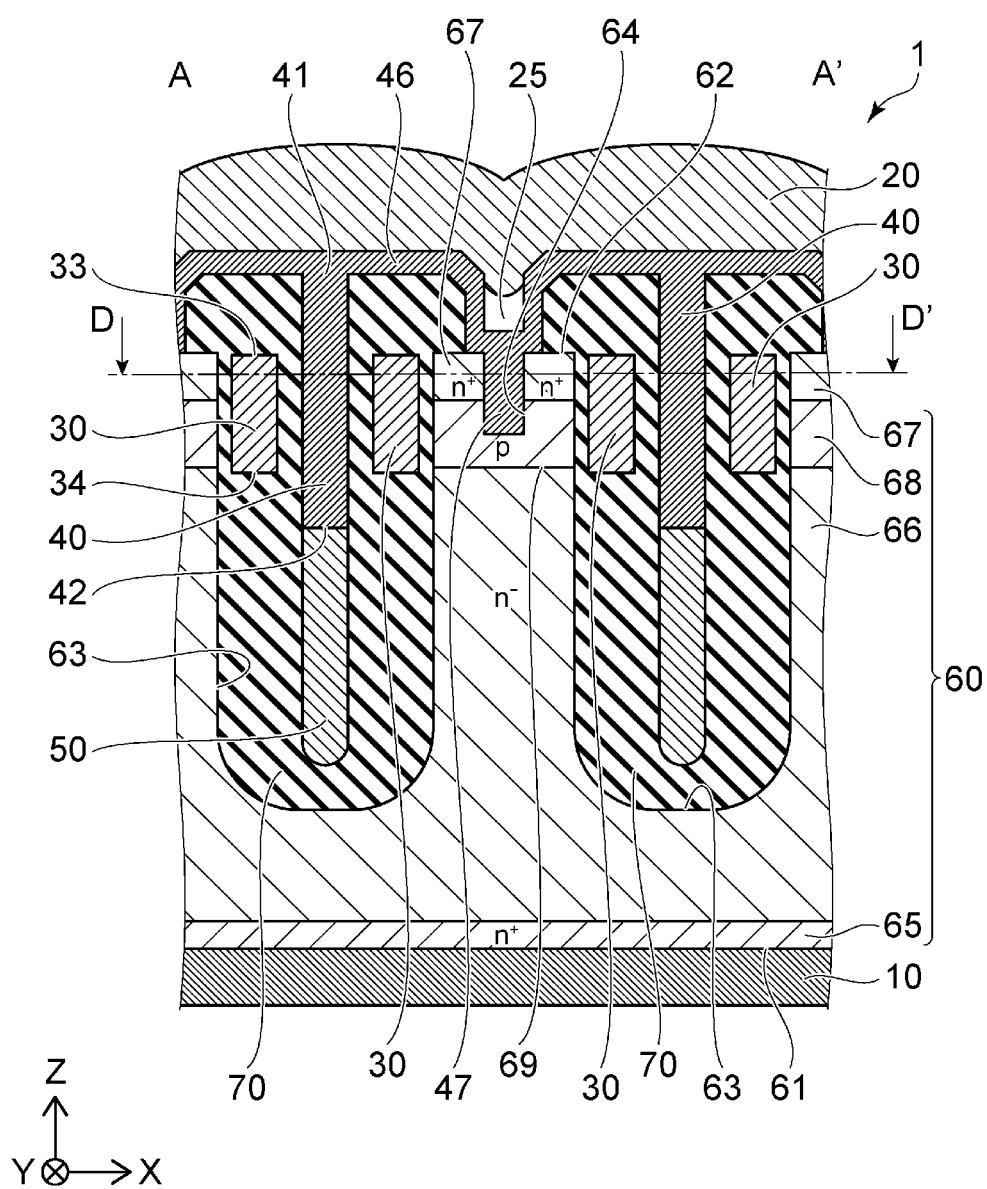
FIG. 3 is a cross-sectional view taken along line A-A' illustrated in FIG. 2.

FIG. 3 is a cross-sectional view taken along line A-A' illustrated in FIG. 2.

Figure 4:
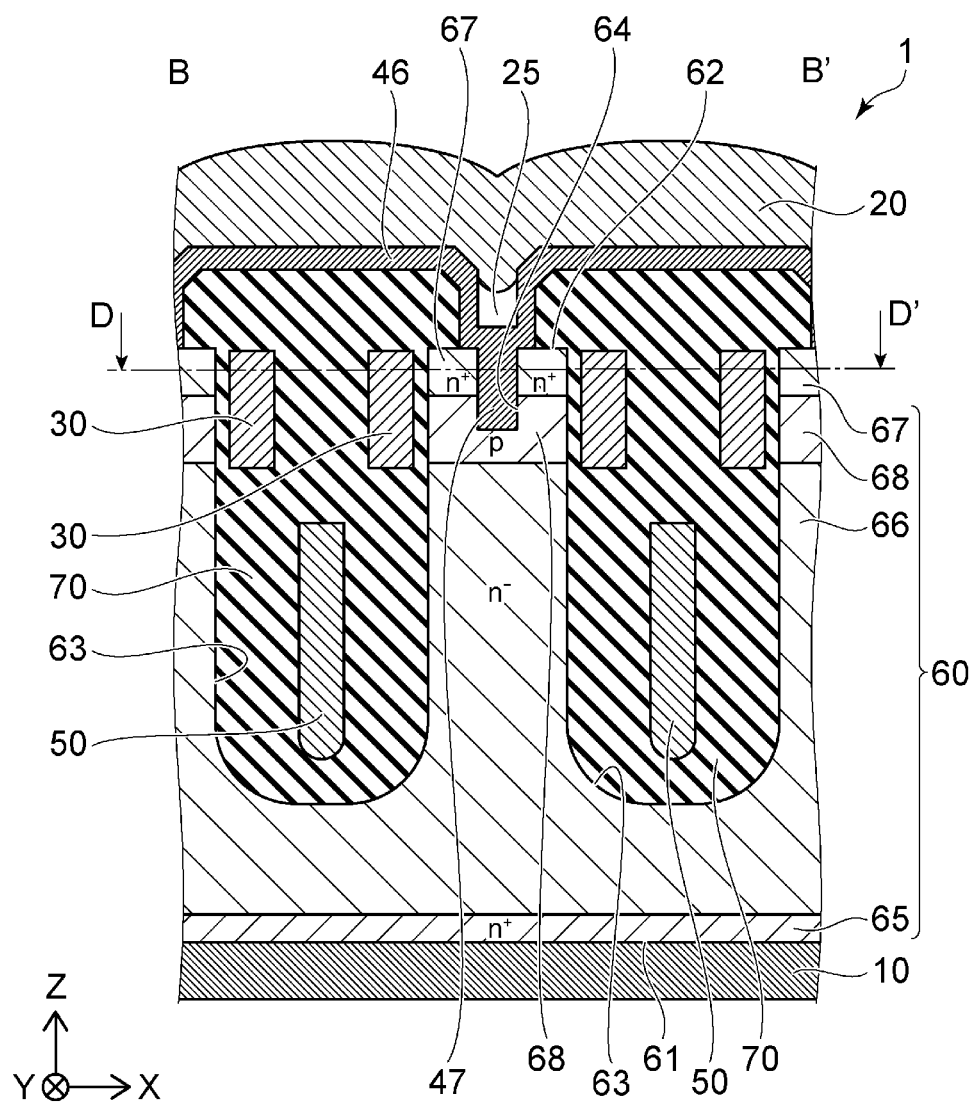
FIG. 4 is a cross-sectional view taken along line B-B' illustrated in FIG. 2.

FIG. 4 is a cross-sectional view taken along line B-B' illustrated in FIG. 2.

Figure 5:
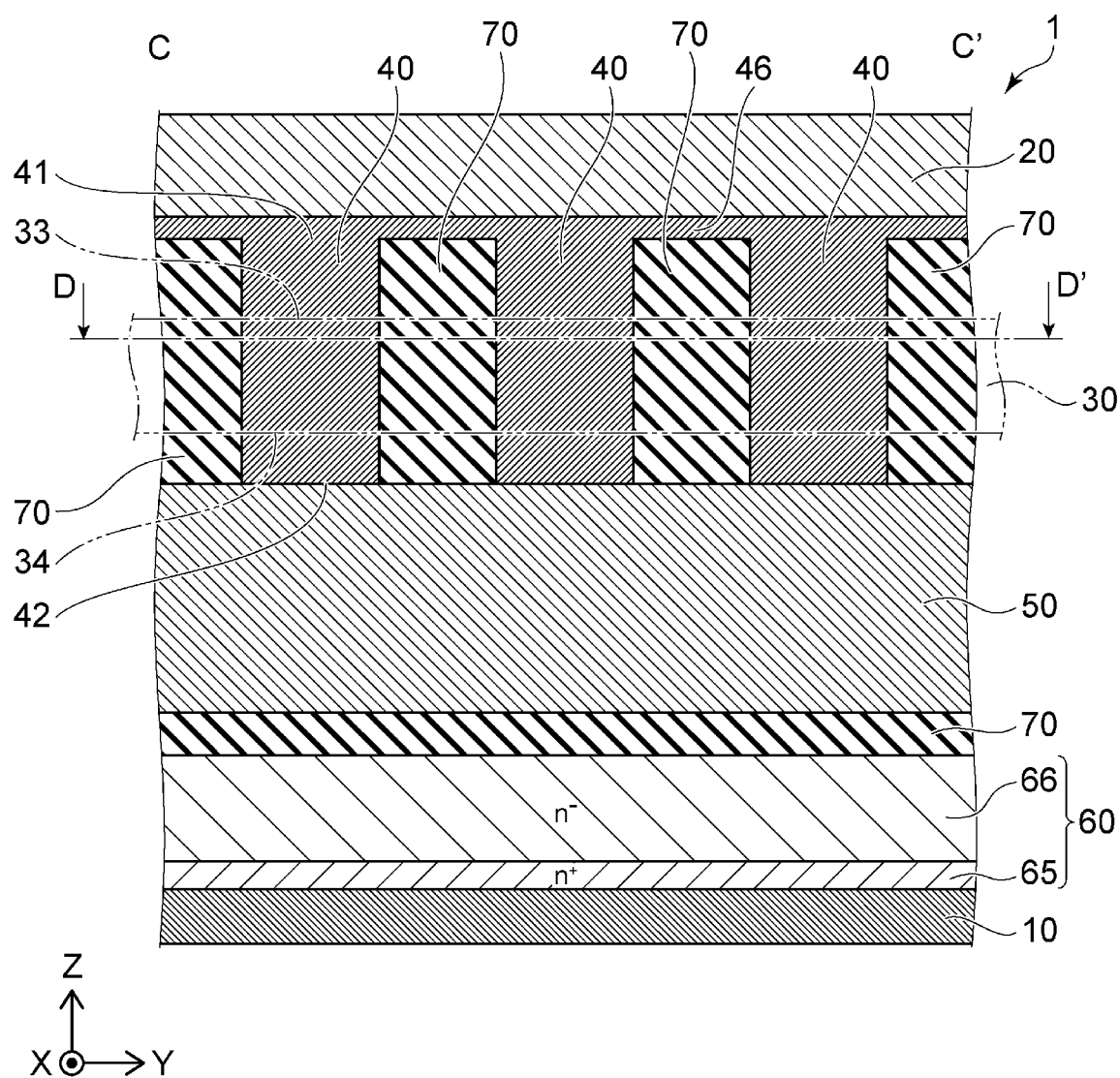
FIG. 5 is a cross-sectional view taken along line C-C' illustrated in FIG. 2.

FIG. 5 is a cross-sectional view taken along line C-C' illustrated in FIG. 2.

The semiconductor device 1 according to the first embodiment includes a drain electrode 10, a source electrode 20, a gate electrode 30, an upper embedded electrode 40, a lower embedded electrode 50, a semiconductor member 60 (a semiconductor layer), and an insulating member 70. The drain electrode 10, the source electrode 20, and the gate electrode 30 are formed from a metal. The semiconductor member 60 is formed from a semiconductor material. The insulating member 70 is formed from an insulating material.

The semiconductor member 60 is disposed between the drain electrode 10 and the source electrode 20. The gate electrode 30 is disposed in the semiconductor member 60. A shape of the semiconductor member 60 is, for example, a rectangular plate shape. The semiconductor member 60 is formed from, for example, monocrystalline silicon (Si) and a conductivity type of each element/region in the semiconductor member 60 is either a p-type or an n-type formed by local impurity implantation or the like.

In the present specification, an XYZ orthogonal coordinate system is adopted hereinafter for the sake of convenience of description. It is assumed that a direction from the drain electrode 10 to the source electrode 20 is a "Z direction", an extension direction of the gate electrode 30 is a "Y direction", and a direction orthogonal to the Z direction and the Y direction is an "X direction". The X direction and the Y direction are orthogonal to each other. While in the description the +Z direction may be referred to as an "upward direction" and −Z direction may be referred to as a "downward direction", the expressions are used for the sake of descriptive convenience and no specific relationship to a direction of gravity is intended.

As illustrated in FIGS. 1A and 1B, the drain electrode 10 is disposed on an entire lower surface 61 of the semiconductor member 60. A gate pad 31 and a frame-like interconnection section 32 are provided on an outer edge portion of an upper surface 62 of the semiconductor member 60. The gate pad 31 is provided on, for example, one corner portion of the upper surface 62 of the semiconductor member 60. The interconnection section 32 is connected to the gate pad 31. In the present context, reference to a "connection" or being "connected" means an "electrical connection" or being "electrically connected". The source electrode 20 is disposed on a region surrounded by the gate pad 31 and the interconnection section 32 on the upper surface 62 of the semiconductor member 60. The source electrode 20 is isolated from the gate pad 31 and the interconnection section 32.

As illustrated in FIGS. 2 to 5, a plurality of trenches 63 are formed from an upper surface 62-side into the semiconductor member 60 along the Z direction in the depth direction. The trenches 63 extend lengthwise in the Y direction. The plurality of trenches 63 are spaced from one another in the X direction. The trenches 63 do not reach the lower surface 61 of the semiconductor member 60. The insulating member 70 is disposed in each trench 63. An upper portion of the insulating member 70 protrudes upward beyond the upper surface 62 of the semiconductor member 60 and extends to both sides in the X direction of each trench 63. The two insulating members 70 adjacent in the X direction to one another are isolated from each other. The insulating members 70 contain, for example, one of silicon oxide or silicon nitride. It is noted that the insulating members 70 may be formed either integrally or as a fully separate.

A metal film 46 is provided between the insulating members 70 and the source electrode 20. The metal film 46 is also between the semiconductor member 60 and the source electrode 20. The metal film 46 covers upper surfaces and side surfaces of portions of the insulating members 70 protruding from the upper surface 62, and covers the upper surface 62 of the semiconductor member 60 between adjacent insulating members 70. The metal film 46 is brought into contact with and connected to the source electrode 20. It is noted that a void 25 may be formed (left) between the source electrode 20 and a portion of the metal film 46 on the upper surface 62.

Two gate electrodes 30 are disposed in each trench 63. The gate electrodes 30 are isolated from the semiconductor member 60 via the insulating member 70. An end portion in the Y direction of each of the gate electrodes 30 is extracted up to the upper surface 62 of the semiconductor member 60 and connected to the interconnection section 32. The gate electrodes 30 are thereby connected to the gate pad 31 via the interconnection section 32.

A plurality of upper embedded electrodes 40 are disposed between the two gate electrodes 30 of each trench 63. The plurality of upper embedded electrodes 40 are arranged in line intermittently along the Y direction. In other words, a plurality of upper embedded electrodes 40 are provided spaced from one another along the Y direction. Part of the insulating member 70 is disposed between the upper embedded electrodes 40 adjacent to one another in the Y direction. In addition, the upper embedded electrodes 40 are isolated from the gate electrodes 30 via part of the insulating member 70.

In a row of the plurality of upper embedded electrodes 40 arranged in line along the Y direction, a ratio of the length occupied by the upper embedded electrodes 40 to a unit length L along the Y direction is referred to as "ratio rs". This ratio rs of the semiconductor device 1 may be freely adjusted during design, with the ratio rs being higher than zero but less than one and is, for example, 0.5.

In FIG. 2, the upper embedded electrodes 40 are periodically arranged along the Y direction and the unit length L is the length corresponding to an arrangement period of the upper embedded electrodes 40. Since there are gaps between left between the adjacent upper embedded electrodes 40, the ratio rs is less than 1 as depicted since there are gaps left between adjacent upper embedded electrodes in the Y direction. However, when the upper embedded electrodes 40 are not arranged periodically, the unit length L can be set to a length that includes a particular number of upper embedded electrodes 40 or the like. The unit length L can be assumed to be, for example, a length that includes at least five upper embedded electrodes 40 and the corresponding number of gaps between upper embedded electrodes 40, and the ratio rs (the occupied percentage of the unit length L) may be calculated on this basis.

An upper end 41 of each upper embedded electrode 40 is located above an upper end 33 of each gate electrode 30, that is, closer to the source electrode 20. Each upper embedded electrode 40 is extracted up to an upper surface of the insulating member 70 and the upper end 41 of the upper embedded electrode 40 comes into contact with the metal film 46. The upper embedded electrode 40 is thereby connected to the source electrode 20 via the metal film 46. A lower end 42 of the upper embedded electrode 40 is located below a lower end 34 of each gate electrode 30, that is, closer to the drain electrode 10.

A row of the plurality of upper embedded electrodes 40 arranged in line along the Y direction is provided for each trench 63. Owing to this, a plurality of rows of upper embedded electrodes 40 are provided over the entire semiconductor device 1 and spaced from each other in the X direction. In addition, in the first embodiment, positions of the upper embedded electrodes 40 in the Y direction are the same between the two adjacent columns. In a view of the two columns from, for example, the X direction, a length in the Y direction of a region where one upper embedded electrode 40 overlaps the other upper embedded electrode 40 is equal to or greater than a half of a length in the Y direction of the one upper embedded electrode 40. Therefore, the upper embedded electrodes 40 are arranged in a matrix in a view from the Z direction.

A trench 64 is formed between the trenches 63 in the upper surface 62 of the semiconductor member 60. The trench 64 extends lengthwise in the Y direction. A source plug 47 is provided in the trench 64. An upper end of the source plug 47 comes into contact with the metal film 46. The source plug 47 is thereby connected to the source electrode 20 via the metal film 46.

For example, the upper embedded electrodes 40, the metal film 46, and the source plug 47 are formed integrally or in the same processing steps. The upper embedded electrodes 40, the metal film 46, and the source plug 47 contain at least one metal selected from a group consisting of, for example, aluminum (Al), copper (Cu), tungsten (W), titanium (Ti), cobalt (Co), and nickel (Ni), or may contain, for example, a metallic compound or an alloy formed from any metal such as those listed in the above group.

One lower embedded electrode 50 is disposed below the plurality of upper embedded electrodes 40 in each trench 63. The lower embedded electrode 50 extends in the Y direction and comes into contact with lower ends 42 of the plurality of upper embedded electrodes 40. One lower embedded electrode 50 is thereby connected to the plurality of upper embedded electrodes 40 in each trench 63. The lower embedded electrode 50 is, therefore, connected to the source electrode 20 via the plurality of upper embedded electrodes 40 and the metal film 46. The lower embedded electrode 50 contains silicon and is formed by, for example, impurity-implanted (doped) polysilicon.

The insulating member 70 is disposed between the lower embedded electrode 50 and the semiconductor member 60. The lower embedded electrode 50 is disposed between the drain electrode 10 and the plurality of upper embedded electrodes 40 in the semiconductor member 60. Though connected to the plurality of upper embedded electrodes 40, the lower embedded electrode 50 is isolated from the semiconductor member 60 and the drain electrode 10.

In this way, the insulating members 70 are disposed between the semiconductor member 60 and the gate electrodes 30, between the gate electrodes 30 and the upper embedded electrodes 40, between the gate electrodes 30 and the metal film 46, between the semiconductor member 60 and the upper embedded electrodes 40, and between the semiconductor member 60 and the lower embedded electrode 50.

A drain layer 65 of an n+ conductivity type, a drift layer 66 of an n− conductivity type, a source layer 67 of an n+ conductivity type, and a base layer 68 of a p conductivity type are provided as portions/regions of the semiconductor member 60. A carrier concentration in the source layer 67 is higher than carrier concentrations in the drain layer 65 and the drift layer 66. In this context, "carriers" are either electrons or holes. The drain layer 65 is at the lower surface 61 of the semiconductor member 60 and is disposed between the drain electrode 10 and the drift layer 66. Owing to this, the drift layer 66 is connected to the drain electrode 10 via the drain layer 65. The source layer 67 is at the upper surface 62 of the semiconductor member 60 and comes into contact with the metal film 46 and the source plug 47. Owing to this, the source layer 67 is connected to the source electrode 20 via the source plug 47 and the metal film 46.

The base layer 68 is disposed between the drift layer 66 and the source layer 67 and comes into contact with the drift layer 66 and the source layer 67. The base layer 68 comes into contact with the source plug 47 and is connected to the source electrode 20 via the source plug 47 and the metal film 46. As described above, the lower ends 42 of the upper embedded electrodes 40 are located below the lower ends 34 of the gate electrodes 30. It is preferable that the upper embedded electrodes 40 are also located below a pn interface 69 between the drift layer 66 and the base layer 68, that is, closer to the drain electrode 10.

Operations of semiconductor device 1 according to the first embodiment will be described.

A voltage is applied between the drain electrode 10 and the source electrode 20 so that a potential of the drain electrode 10 is higher than a potential of the source electrode 20. When a voltage higher than a threshold voltage is applied to the gate electrodes 30 in this state, an inversion layer (channel) is formed in each region of the base layer 68 coming into contact with the insulating members 70. Electrons thereby flow from the source electrode 20 to the drain electrode 10 via the metal film 46, the source layer 67, the inversion layer formed in the base layer 68, the drift layer 66, and the drain layer 65. As a result, the semiconductor device 1 is turned on and a current is passed from the drain electrode 10 to the source electrode 20.

When potentials of the gate electrodes 30 are lower than a threshold voltage, the inversion layer formed in the base layer 68 disappears (is not formed) and a depletion layer starting at the pn interface 69 between the drift layer 66 and the base layer 68 spreads. Since the same potential as that of the source electrode 20 is applied to the upper embedded electrodes 40 and the lower embedded electrode 50, the depletion layer also spreads from a surface of the drift layer 66 in contact with the insulating members 70. That is, the depletion layer spreads downward from the pn interface 69 in the drift layer 66 and spreads from the insulating members 70 in the X direction. The semiconductor device 1 is thereby turned off and the current from the drain electrode 10 to the source electrode 20 is cut off.

When a state of the semiconductor device 1 switches from an On-state to an Off-state, a voltage between the source electrode 20 and the drain electrode 10 rapidly increases. The potential of the source electrode 20 is also transmitted to the lower embedded electrode 50 via the metal film 46 and the upper embedded electrodes 40. If the semiconductor device 1 is turned off and the potential of the lower embedded electrode 50 increases, then the insulating members 70 function as a parasitic capacitance between the lower embedded electrode 50 and the drain electrode 10, and a charge-discharge of electrons occurs. The voltage between the source electrode 20 and the drain electrode 10 thereby oscillates and then eventually converges towards a predetermined voltage.

Certain functions and advantageous effects of the first embodiment will next be described.

As illustrated in FIG. 2, the plurality of upper embedded electrodes 40 are arranged intermittently along the Y direction in the semiconductor device 1 according to the first embodiment. Owing to this, adjusting a length of each upper embedded electrode 40 and a distance between the upper embedded electrodes 40 in the Y direction makes it possible to adjust the ratio rs of the upper embedded electrodes 40 to the unit length L along the Y direction. Adjusting this ratio rs at a time of designing the semiconductor device 1 allows for adjusting a source resistance. The source resistance is the resultant resistance of the four resistances including a resistance of the upper embedded electrodes 40, a resistance of the source electrode 20, a resistance of the lower embedded electrode 50, and the contact resistances of joint surfaces of the upper embedded electrode 40, the source electrode 20, and the lower embedded electrode 50.

The lower embedded electrode 50 can also be referred to as "field plate electrode" in some instances. Providing the lower embedded electrode 50 allows for an increase in an impurity concentration in the drift layer 66 with a breakdown voltage of the semiconductor device 1 being maintained or substantially so. It is thereby possible to reduce an on-resistance of the semiconductor device 1.

The source resistance affects the followability of the potential of the lower embedded electrode 50 to a potential change of the source electrode 20. With an extremely high source resistance, the potential of the lower embedded electrode 50 is unable to promptly follow the potential change of the source electrode 20 at the time of switchover between on and off states of the semiconductor device 1. There may also be carrier emission from the semiconductor device 1 delays and switching efficiency decreases. On the other hand, with an extremely low source resistance, an oscillation of the potential of the lower embedded electrode 50 becomes conspicuous at the time of the switchover between on and off of the semiconductor device 1, and the switching efficiency similarly decreases. An optimum value for the source resistance may be determined based on a chip size, a necessary breakdown voltage, and the like of the semiconductor device 1.

Conventionally, semiconductor devices are designed so that the lower end 42 of each upper embedded electrode 40 is located near the upper end 33 of each gate electrode 30. Owing to this, the resistance of the lower embedded electrode 50 will be higher than the upper embedded electrodes 40 and predominantly determine the value of the source resistance. Since the value of the resistance of the lower embedded electrode 50 is determined by process conditions and the like, it would thus be difficult to adjust the value of the source resistance to an arbitrary design value or the like. However, according to the present embodiment, adjusting the ratio rs of the upper embedded electrodes 40 to the unit length L causes a change in a resistance ratio of the upper embedded electrodes 40 to the lower embedded electrode 50 and makes the resistance of the upper embedded electrodes 40 dominant in the source resistance. It is, therefore, possible to adjust the value of the source resistance depending on a selectable design structure of the semiconductor device 1. As a result, it is possible to adjust the value of the source resistance depending on ultimate uses of the semiconductor device 1.

Moreover, in the semiconductor device 1, the plurality of upper embedded electrodes 40 are disposed intermittently along the Y direction. Owing to this, a capacitance between the upper embedded electrodes 40 and the gate electrodes 30 is relatively small compared with a case where just one upper embedded electrode 40 is disposed continuously along the Y direction. For this reason, a capacitance between a source structure that includes the source electrode 20, the upper embedded electrodes 40, and the lower embedded electrode 50 and a periphery of the source structure is smaller. This can also improve efficiency of the semiconductor device 1.

Modification of First Embodiment

Figure 6A:
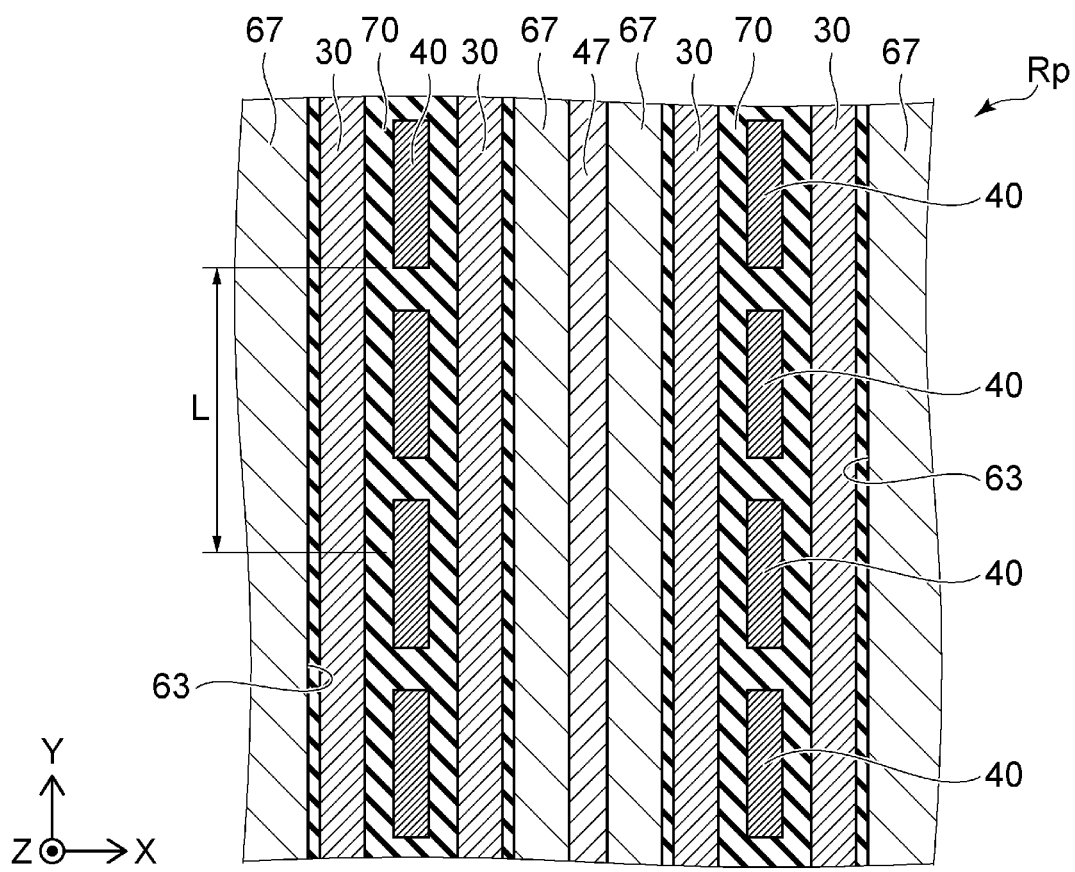
FIG. 6A illustrates a termination region of a modification example.
Figure 6B:
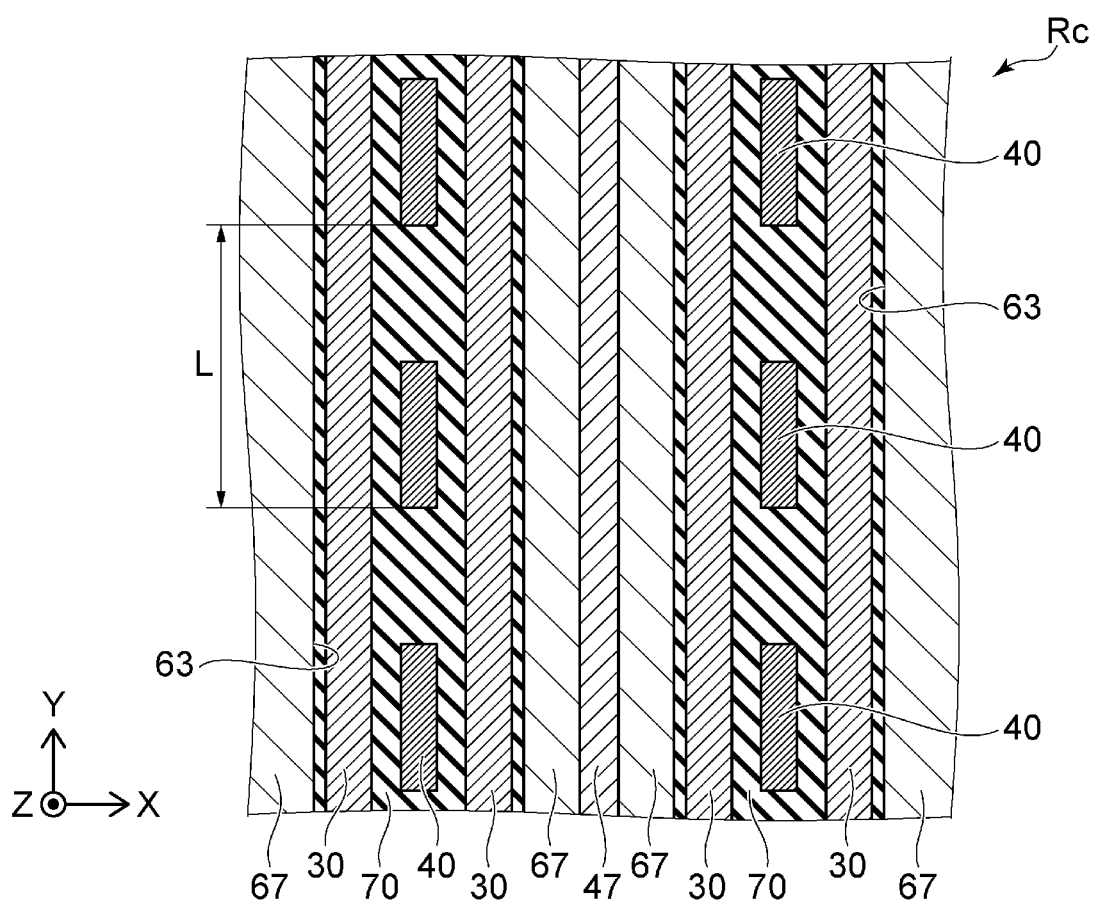
FIG. 6B illustrates a cell region of a modification example.

FIGS. 6A and 6B are top views illustrating a semiconductor device according to a modification of the first embodiment. FIG. 6A illustrates a termination region Rp corresponding to that of FIG. 1A and FIG. 6B illustrates a cell region Rc corresponding to that of FIG. 1A.

According to the present modification, the cell region Rc is a region where a source-drain current flows, and the termination region Rp is a region where an effective source-drain current does not flow. The termination region Rp is disposed around the cell region Rc.

As illustrated in FIGS. 6A and 6B, the ratio rs of the upper embedded electrodes 40 to the unit length L along the Y direction differs between the cell region Rc and the termination region Rp located on both sides in the Y direction of the cell region Rc. The ratio rs in the termination region Rp is higher than the ratio rs in the cell region Rc. For example, the length of each upper embedded electrode 40 in the termination region Rp in the Y direction is equal to the length of each upper embedded electrode 40 in the cell region Rc, and the distance between the upper embedded electrodes 40 in the termination region Rp is smaller than the distance between the upper embedded electrodes 40 in the cell region Rc.

According to the present modification, setting the ratio rs in the termination region Rp higher than the ratio rs in the cell region Rc makes it possible to prevent a reduction in the breakdown voltage in the termination region Rp. Furthermore, setting the length of each upper embedded electrode 40 equal in the Y direction allows for equalization of process conditions.

The ratio rs in a termination region located at both end portions of the X direction of the semiconductor device may be similarly set higher than the ratio rs in the cell region Rc. It is noted that even when the ratio rs in the termination region located at both end portions in the X direction is set equal to the ratio rs in the cell region Rc, it is still possible to prevent the reduction in the breakdown voltage by a method of, for example, providing a dummy trench structure.

Configurations other than those described above, operations, functions, and advantageous effects of the present modification are similar to those of the first embodiment.

Second Embodiment

Figure 7:
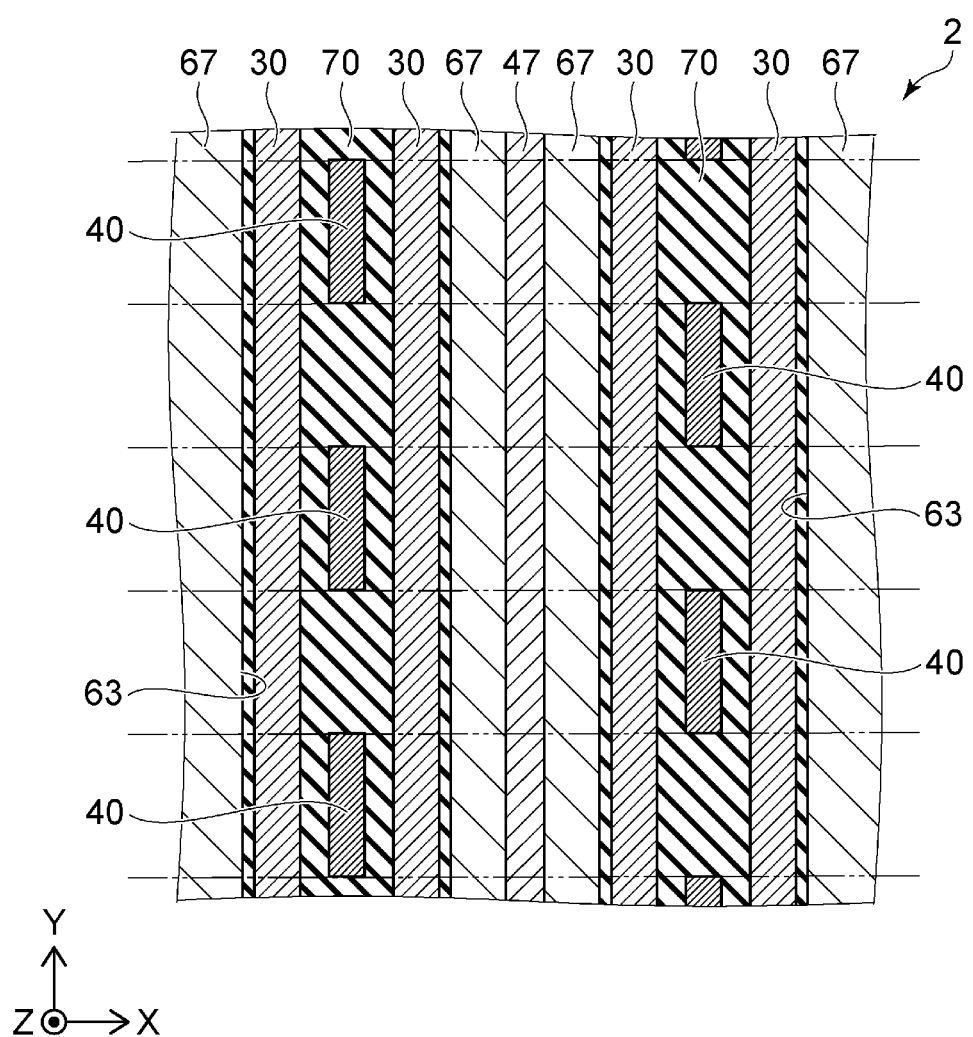
FIG. 7 is a top view illustrating a semiconductor device according to a second embodiment.

FIG. 7 is a top view illustrating a semiconductor device according to a second embodiment.

As illustrated in FIG. 7, in a semiconductor device 2 according to the present embodiment, the upper embedded electrodes 40 are disposed in a staggered fashion as viewed from the Z direction. That is, among the rows of the plurality of upper embedded electrodes 40 arranged in line along the Y direction, any two columns adjacent to each other in the X direction differ in the positions of the upper embedded electrodes 40 along the Y direction. In a view of the two columns from, for example, the X direction, the length in the Y direction of the region where one upper embedded electrode 40 overlaps the other upper embedded electrode 40 is less than the half of the length in the Y direction of the one upper embedded electrode 40.

According to the second embodiment, it is possible to further equalize a distribution of the depletion layer when the semiconductor device 2 is turned off and improve the breakdown voltage of the semiconductor device 2.

Configurations other than those described above, operations, functions, and advantageous effects of the present embodiment are similar to those of the first embodiment.

Third Embodiment

Figure 8:
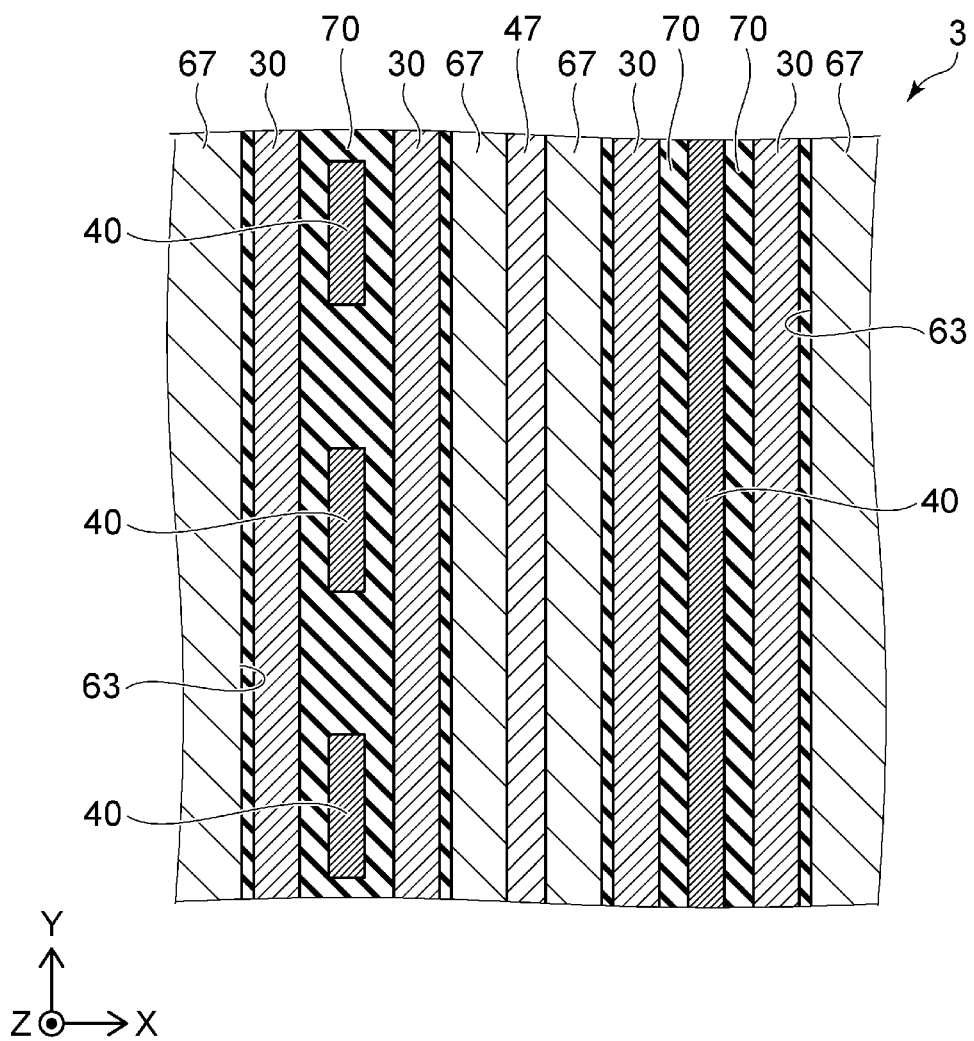
FIG. 8 is a top view illustrating a semiconductor device according to a third embodiment.

FIG. 8 is a top view illustrating a semiconductor device according to a third embodiment.

As illustrated in FIG. 8, in a semiconductor device 3 according to the third embodiment, the trench 63 in which the plurality of upper embedded electrodes 40 are disposed intermittently along the Y direction and a trench 63 in which one upper embedded electrode 40 extending in the Y direction is disposed are alternately arranged with one another along the X direction.

According to the third embodiment, the ratio rs is higher than zero and lower than one in the trench 63 in which the plurality of upper embedded electrodes 40 are disposed intermittently, and the ratio rs is one in the trench 63 in which one upper embedded electrode 40 extending in the Y direction is disposed. In this case, it is possible to similarly adjust an average value of the ratios rs in the entire semiconductor device 3 and adjust the source resistance.

Configurations other than those described above, operations, functions, and advantageous effects of the present embodiment are similar to those of the first embodiment.

Fourth Embodiment

Figure 9:
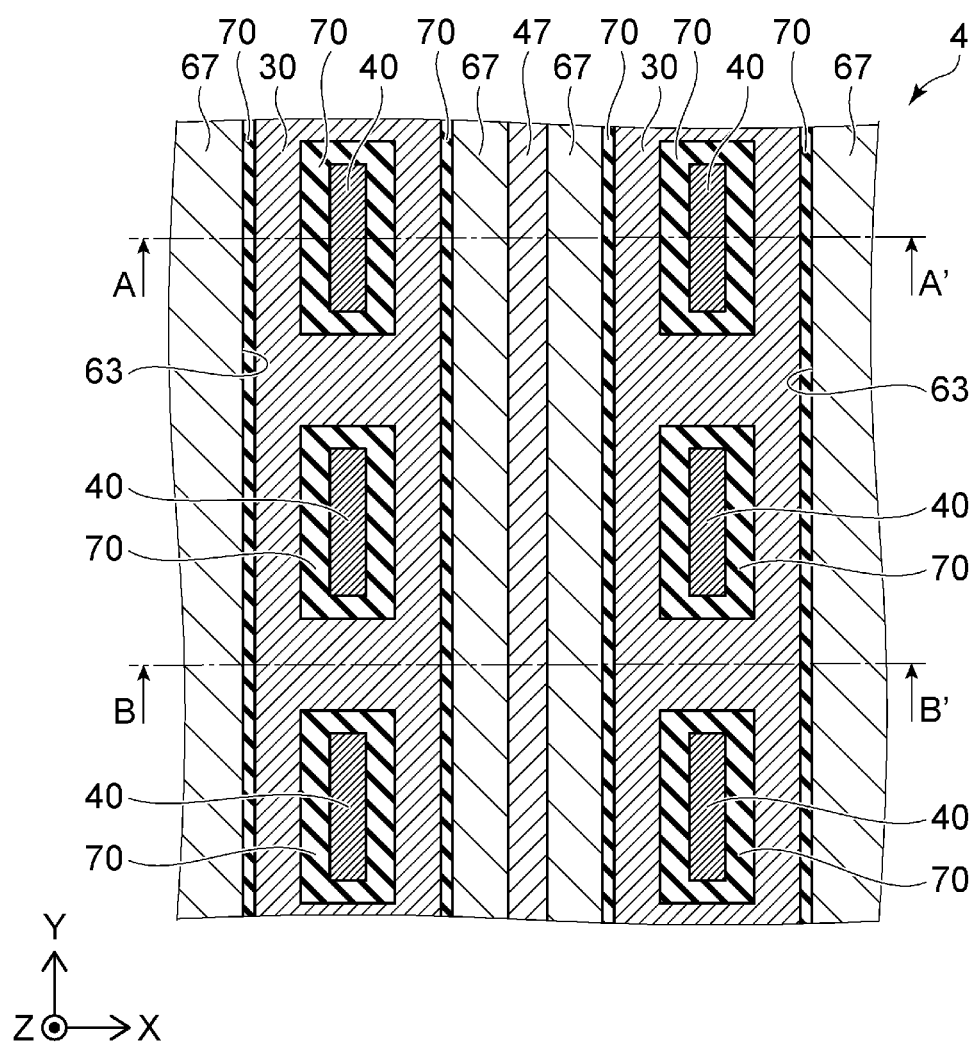
FIG. 9 is a top view illustrating a semiconductor device according to a fourth embodiment.

FIG. 9 is a top view illustrating a semiconductor device according to a fourth embodiment.

Figure 10:
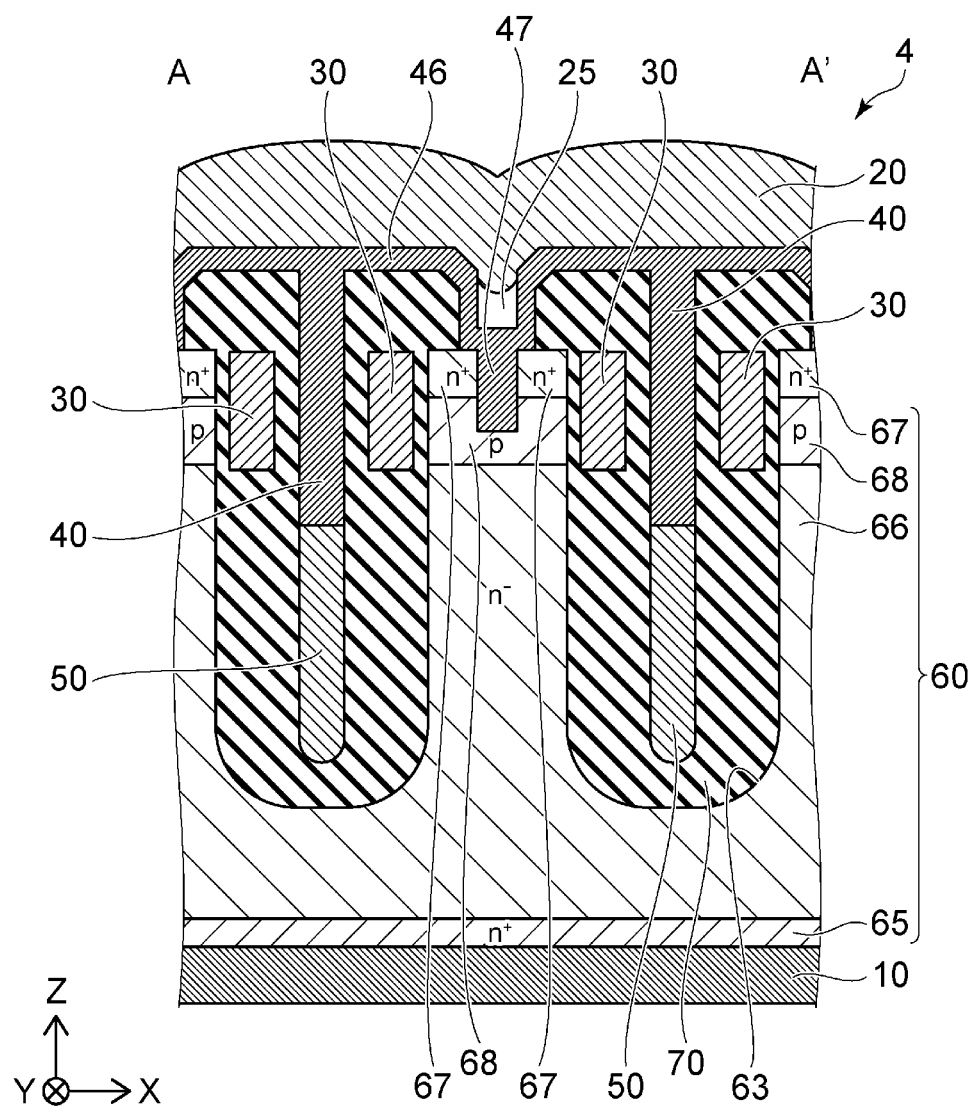
FIG. 10 is a cross-sectional view taken along line A-A' illustrated in FIG. 9.

FIG. 10 is a cross-sectional view taken along line A-A' illustrated in FIG. 9.

Figure 11:
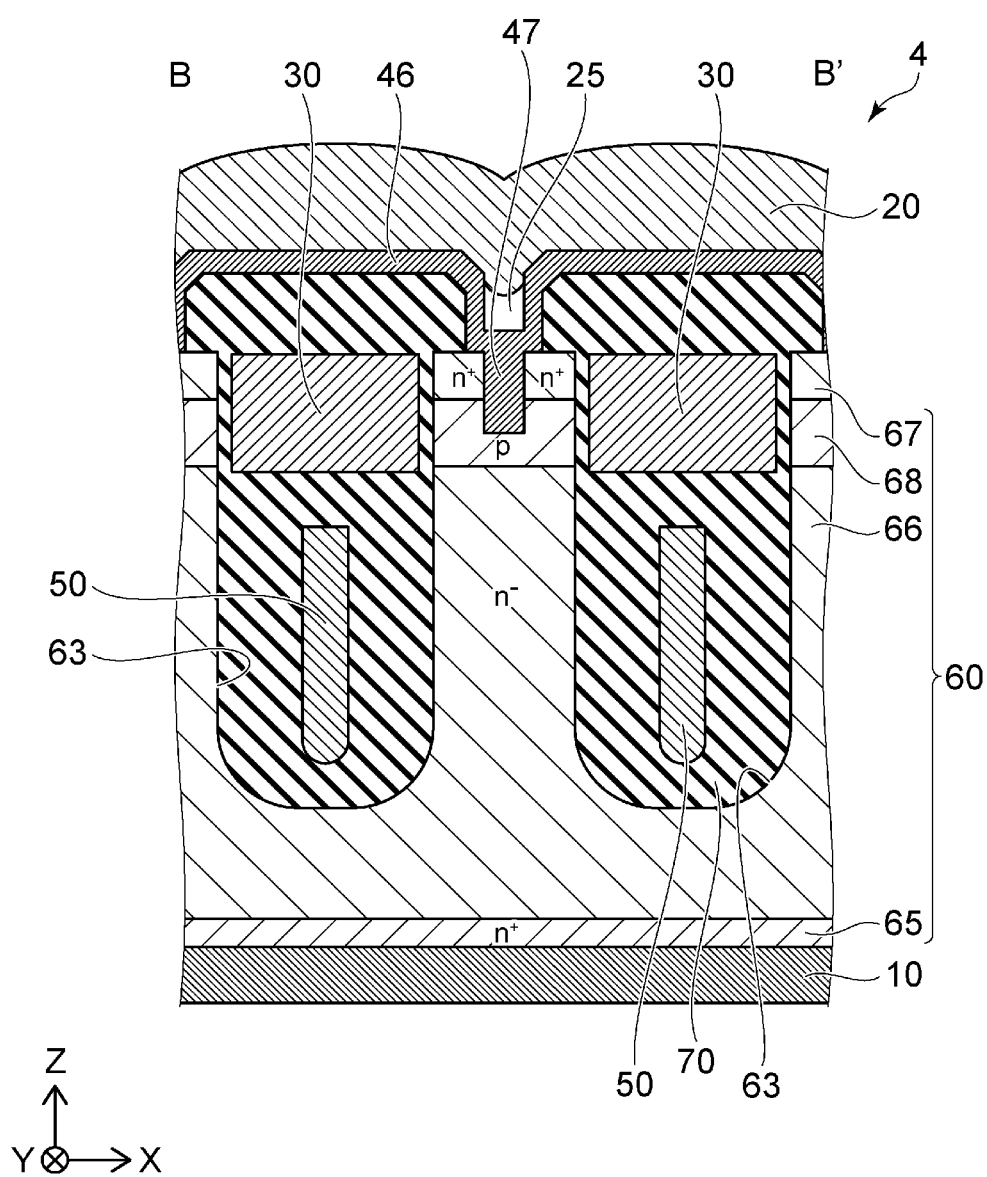
FIG. 11 is a cross-sectional view taken along line B-B' illustrated in FIG. 9.

FIG. 11 is a cross-sectional view taken along line B-B' illustrated in FIG. 9.

As illustrated in FIGS. 9 to 11, in a semiconductor device 4 according to the fourth embodiment, the gate electrode 30 is also disposed between the upper embedded electrodes 40 adjacent in the Y direction. As a result, in a view from the Z direction, a shape of the gate electrode 30 is thus a ladder shape and the gate electrode 30 surrounds each upper embedded electrode 40 via the insulating member 70. In other words, the two gate electrodes 30 extending in the Y direction and a plurality of bridge portions joining the two gate electrodes 30 are provided in each trench 63, and each bridge portion is disposed between the two upper embedded electrodes 40 adjacent in the Y direction.

According to the fourth embodiment, it is possible to reduce the resistance of the gate electrodes 30.

Configurations other than those described above, operations, functions, and advantageous effects of the present embodiment are similar to those of the first embodiment.

Fifth Embodiment

Figure 12:
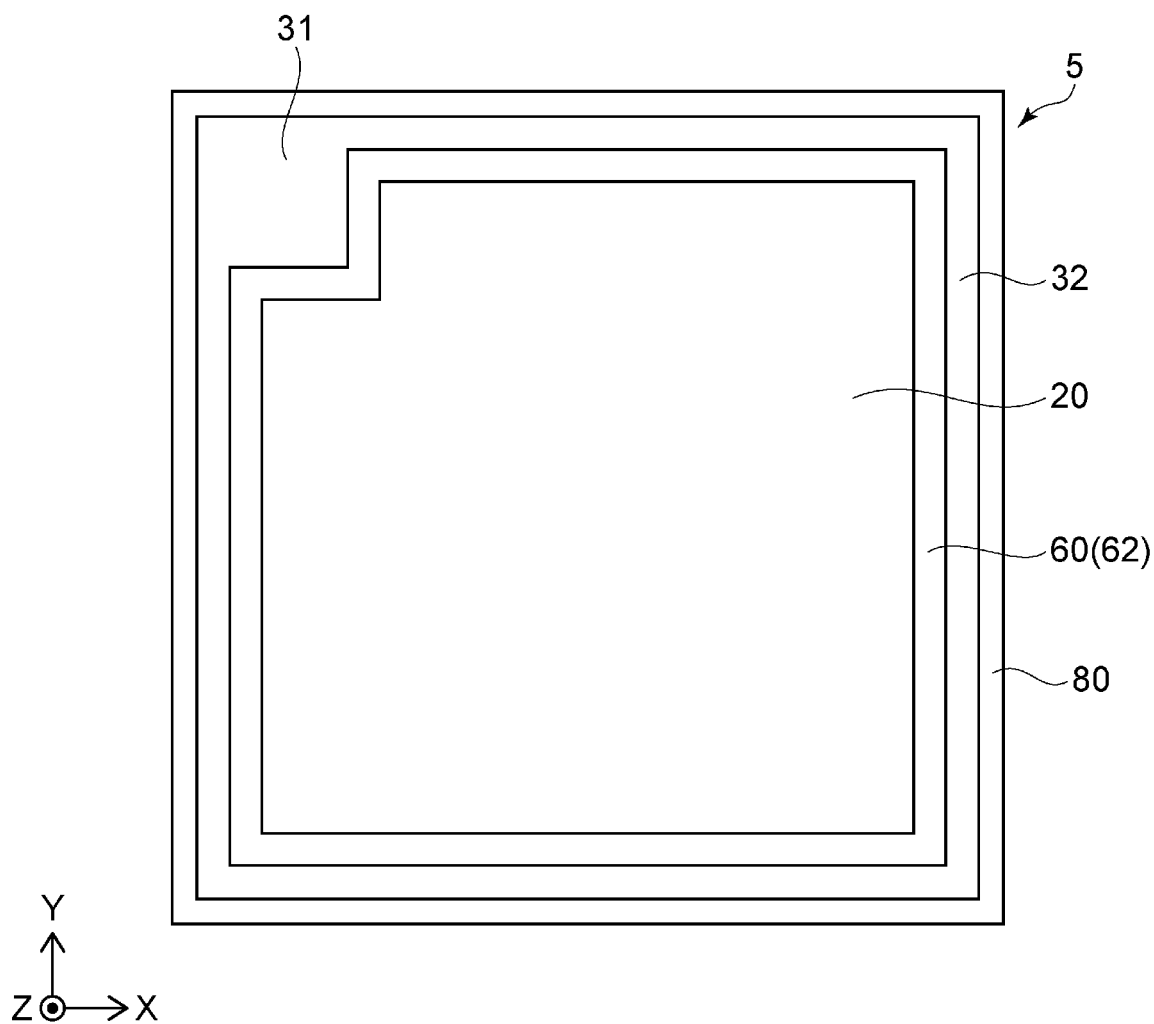
FIG. 12 is a top view illustrating a semiconductor device according to a fifth embodiment.

FIG. 12 is a top view illustrating a semiconductor device according to a fifth embodiment.

As illustrated in FIG. 12, in a semiconductor device 5 according to the fifth embodiment, an outer edge region 80 is provided outside of the gate pad 31 and the interconnection section 32 on the upper surface 62 of the semiconductor member 60. The outer edge region 80 is a margin region in the dicing for cutting a semiconductor wafer into a plurality of semiconductor devices 5, and disposed in a frame-like fashion along an outer peripheral edge of each semiconductor device 5. Electrodes and interconnections are not disposed in the outer edge region 80. The drain electrode 10 is disposed on the entire lower surface 61 of the semiconductor member 60. Configurations other than those described above, operations, functions, and advantageous effects of the present embodiment are similar to those of the first embodiment.

Sixth Embodiment

Figure 13:
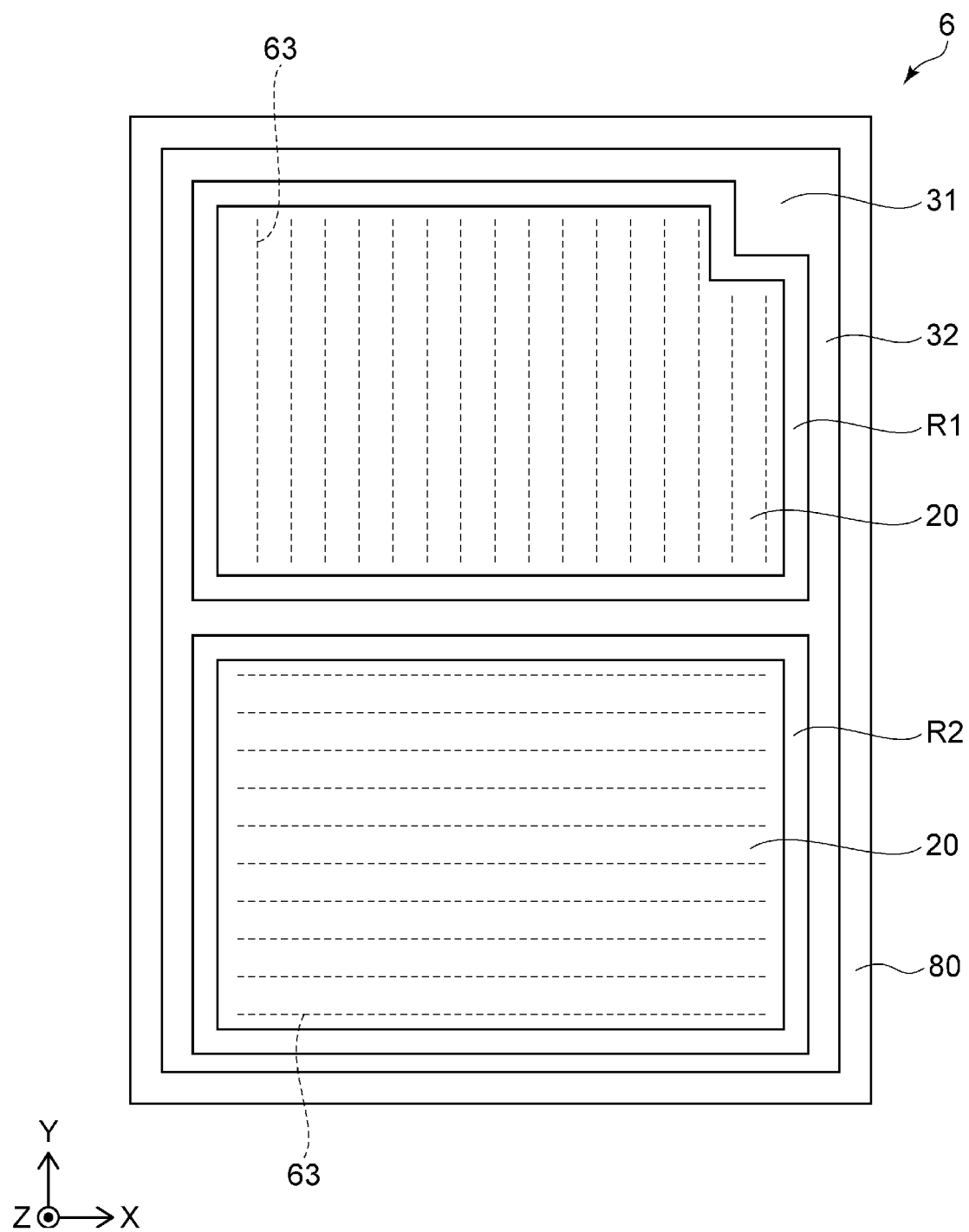
FIG. 13 is a top view illustrating a semiconductor device according to a sixth embodiment.

FIG. 13 is a top view illustrating a semiconductor device according to a sixth embodiment.

The extension direction of each trench 63 is represented by a broken line.

As illustrated in FIG. 13, regions R1 and R2 are set in a semiconductor device 6 according to the sixth embodiment. The regions R1 and R2 are spaced from each other along the Y direction, for example. In the region R1, the trenches 63 extend lengthwise in the Y direction similarly to the first embodiment. In the region R2, the trenches 63 extend lengthwise in the X direction. Separate source electrodes 20 are provided for the regions R1 and R2, respectively. In some examples, the source electrode 20 provided in the region R1 and the source electrode 20 provided in the region R2 can be connected to each other by wires, connectors, or the like at a time of assembly of a package, and used as a single electrode.

The interconnection section 32 is disposed around the region R1, around the region R2, and between the regions R1 and R2. The outer edge region 80 is provided around the interconnection section 32 and the gate pad 31. The drain electrode 10 is disposed on the entire lower surface 61 of the semiconductor member 60 and common to the regions R1 and R2.

The semiconductor member 60 tends to be somewhat curved (bowed or warped) in the Z direction with the direction perpendicular to the extension direction of the trenches 63 taken as an axis. For example, since the trenches 63 extend in the Y direction in the region R1, the shape of the semiconductor member 60 will tend to be curved upward or downward (in the Z direction) about the X direction axis. However, in the region R2, the shape of the semiconductor member 60 will tend to be curved upward or downward (in the Z direction) about the Y direction axis. Thus, in the sixth embodiment, since the extension direction of the trenches 63 in the region R1 is orthogonal to the extension direction of the trenches 63 in the region R2, the curve/bowing tendencies will tend to offset, which produces an advantageous effect that the semiconductor device 6 is less likely overall to be warped in the Z direction. The same thing would apply to a case where the trenches 63 extend in the X direction in the region R1 and the trenches 63 extend in the Y direction in the region R2. Configurations other than those described above, operations, functions, and advantageous effects of the present embodiment are similar to those of the first embodiment.

According to the above example embodiments, it is possible to realize semiconductor devices that have source resistance values that can be adjusted by change of readily adaptable design parameters.

As necessary, relative highs and lows of impurity concentrations in the semiconductor regions in each of the embodiments may be confirmed using, for example, an SCM (Scanning Capacitance Microscope). The carrier concentration in each semiconductor region may be considered to be equal to the impurity concentration activated in each semiconductor region. Therefore, relative highs and lows of the carrier concentrations in the semiconductor regions may be similarly confirmed using the SCM. Moreover, the impurity concentration in each semiconductor region may be measured by, for example, SIMS (Secondary Ion Mass Spectrometry).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first electrode;
   a second electrode;
   a semiconductor layer between the first electrode and the second electrode in a first direction;
   a third electrode in the semiconductor layer, the third electrode extending in a second direction orthogonal to the first direction;
   a plurality of fourth electrodes that are directly connected to the second electrode and extend in the first direction into the semiconductor layer, the plurality of fourth electrodes being spaced from one another along the second direction; and
   a fifth electrode isolated from the first electrode, the fifth electrode being between the first electrode and the plurality of fourth electrodes and extending in the second direction, the fifth electrode contacting ends of the plurality of fourth electrodes, wherein
   each of the fourth electrodes extends in the first direction to a point that is a distance from the first electrode along the first direction that is less than is a distance from the third electrode to first electrode along the first direction.

2. The semiconductor device according to claim 1, wherein
   the fourth electrodes comprise a metal, and
   the fifth electrode comprises silicon.

3. The semiconductor device according to claim 1, further comprising:
   an insulating material between the semiconductor layer and the third electrode, between the third electrode and the fourth electrodes, between the semiconductor layer and the fourth electrodes, and between the semiconductor layer and the fifth electrode.

4. The semiconductor device according to claim 1, wherein the third electrode surrounds at least one of the plurality of fourth electrodes in a plane orthogonal to the first direction.

5. The semiconductor device according to claim 1, wherein a ratio of an occupied length of the fourth electrodes per a unit length along the second direction in a termination region is higher than a ratio of an occupied length of the fourth electrodes per the unit length along the second direction in a cell region.

6. The semiconductor device according to claim 1, further comprising:
   a plurality of third electrodes extending lengthwise in the second direction and spaced from one another in a third direction orthogonal to the first and second directions.

7. The semiconductor device according to claim 6, wherein the fourth electrodes are at positions along the second direction that are the same as one another.

8. The semiconductor device according to claim 6, wherein the fourth electrodes are at positions along the second direction that are different from one another.

9. The semiconductor device according claim 1, wherein the semiconductor layer includes:
   a first region that is contacting the first electrode and that is of a first conductivity type;
   a second region that is contacting the second electrode and that is of the first conductivity type; and
   a third region that is contacting the first region and the second region and that is of a second conductivity type.

10. The semiconductor device according to claim 9, wherein an end of each of the fourth electrodes is located closer to the first electrode along the first direction than is an interface between the first region and the third region.

11. A semiconductor device, comprising:
    a first electrode;
    a second electrode;
    a semiconductor layer between the first electrode and the second electrode in a first direction; and
    a first plurality of trenches extending into the semiconductor layer in the first direction and lengthwise in a second direction orthogonal to the first direction, wherein
    each trench in the first plurality of trenches includes therein:
      a first insulating material,
      a gate electrode in the first insulating material, the first insulating material separating the gate electrode and the semiconductor layer, the gate electrode extending lengthwise in the second direction,
      a plurality of fourth electrodes that are connected to the second electrode and extend in the first direction into the trench to a depth greater than a lowermost end of the gate electrode in the first direction, the plurality of fourth electrodes being spaced from one another along the second direction, the first insulating material being between adjacent fourth electrodes and between the fourth electrodes and the gate electrode, and
      a fifth electrode in the first insulating material between the first electrode and the plurality of fourth electrodes in the first direction, the fifth electrode extending in the second direction and contacting lowermost ends of the plurality of fourth electrodes.

12. The semiconductor device according to claim 11, wherein
    the plurality of fourth electrodes are metal, and
    the fifth electrode is doped polysilicon.

13. The semiconductor device according to claim 11, wherein an uppermost end of each of the plurality of fourth electrodes extends in the first direction above an uppermost surface of the semiconductor layer.

14. The semiconductor device according to claim 13, wherein a metal film connects fourth electrodes in adjacent trenches.

15. The semiconductor device according to claim 14, further comprising:
    a source plug connected to the metal film and extending in the first direction into the semiconductor layer between adjacent trenches.

16. The semiconductor device according to claim 14, wherein the metal film directly contacts the second electrode.

17. The semiconductor device according to claim 11, wherein
    a ratio of an occupied length of the fourth electrodes per a unit length along the second direction in a termination region is higher than a ratio of an occupied length of the fourth electrodes per a unit length along the second direction in a cell region.

18. The semiconductor device according to claim 11, further comprising:
    a second plurality of trenches extending into the semiconductor layer in the first direction and lengthwise in a third direction orthogonal to the first direction and different from the third direction, the second plurality of trenches being in a region of the semiconductor layer different from the first plurality of trenches, wherein each trench in the second plurality of trenches includes therein:
- a second first insulating material,
- a second gate electrode in the second first insulating material, the first second insulating material separating the second gate electrode and the semiconductor layer, the second gate electrode extending lengthwise in the third direction,
- a plurality of second fourth electrodes that are connected to the second electrode and extend in the first direction into the respective trench in the second plurality of trenches to a depth greater than a lowermost end of the second gate electrode in the first direction, the plurality of second fourth electrodes being spaced from one another along the third direction, the second first insulating material being between adjacent second fourth electrodes and between the second fourth electrodes and the second gate electrode, and
- a second fifth electrode in the second first insulating material between the first electrode and the plurality of second fourth electrodes in the first direction, the second fifth electrode extending in the third direction and contacting lowermost ends of the plurality of second fourth electrodes.

19. The semiconductor device according to claim 11, wherein the fourth electrodes are at positions along the second direction that are the same as one another.

* * * * *